US009343455B2

(12) United States Patent
Gueorguiev et al.

(10) Patent No.: US 9,343,455 B2
(45) Date of Patent: May 17, 2016

(54) APPARATUS AND METHOD FOR HIGH VOLTAGE I/O ELECTRO-STATIC DISCHARGE PROTECTION

(71) Applicant: Knowles Electronics, LLC, Itasca, IL (US)

(72) Inventors: Svetoslav Radoslavov Gueorguiev, Copenhagen S (DK); Claus Erdmann Furst, Roskilde (DK); Tore Sejr Joergensen, Taastrup (DK)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 14/132,512

(22) Filed: Dec. 18, 2013

(65) Prior Publication Data

US 2014/0177113 A1 Jun. 26, 2014

Related U.S. Application Data

(60) Provisional application No. 61/739,284, filed on Dec. 19, 2012.

(51) Int. Cl.
*H02H 9/00* (2006.01)
*H01L 27/02* (2006.01)
*H02H 9/04* (2006.01)
*H02H 9/02* (2006.01)
*H02H 3/22* (2006.01)

(52) U.S. Cl.
CPC ........... *H01L 27/0248* (2013.01); *H02H 9/046* (2013.01)

(58) Field of Classification Search
CPC ...................................................... H02H 9/04
USPC ............................................................ 361/56
See application file for complete search history.

(56) References Cited

U.S. PATENT DOCUMENTS 5,740,261 A 4/1998 Loeppert
6,091,657 A * 7/2000 Chen et al. .................... 365/226
(Continued)

OTHER PUBLICATIONS

International Search Report and Written Opinion for PCT/US2013/076135 dated Apr. 28, 2014, 9 pages.

*Primary Examiner* — Thienvu Tran
*Assistant Examiner* — Lucy Thomas
(74) *Attorney, Agent, or Firm* — Foley & Lardner LLP

(57) ABSTRACT

An electronics chip includes a charge pump and at least one high voltage (HV) electro-static discharge (ESD) module. The charge pump is configured to provide a predetermined voltage across a microphone. The devices described herein are implemented in a standard low voltage CMOS process and has a circuit topology that provides an inherent ESD protection level (when it is powered down), which is higher than the operational (predetermined) DC level. At least one high voltage (HV) electro-static discharge (ESD) module is coupled to the output of the charge pump. The HV ESD module is configured to provide ESD protection for the charge pump and a microelectromechanical system (MEMS) microphone that is coupled to the chip. The at least one HV ESD module includes a plurality of PMOS or NMOS transistors having at least one high voltage NWELL/DNWELL region formed within selected ones of the PMOS or NMOS transistors. The at least one high voltage NWELL/DNWELL region has a breakdown voltage sufficient to allow a low voltage process to be used to construct the chip and still allow the HV ESD module to provide ESD protection for the chip.

10 Claims, 5 Drawing Sheets

(56) References Cited

U.S. PATENT DOCUMENTS

| | | | | |
|---|---|---|---|---|
| 6,535,460 | B2 | 3/2003 | Loeppert | |
| 6,552,469 | B1 | 4/2003 | Pederson | |
| 6,781,231 | B2 | 8/2004 | Minervini | |
| 6,847,090 | B2 | 1/2005 | Loeppert | |
| 7,166,910 | B2 | 1/2007 | Minervini | |
| 7,242,089 | B2 | 7/2007 | Minervini | |
| 7,248,078 | B2 * | 7/2007 | Mitsuda | 326/83 |
| 7,297,567 | B2 | 11/2007 | Loeppert | |
| 7,381,589 | B2 | 6/2008 | Minervini | |
| 7,382,048 | B2 | 6/2008 | Minervini | |
| 7,434,305 | B2 | 10/2008 | Minervini | |
| 7,439,616 | B2 | 10/2008 | Minervini | |
| 7,501,703 | B2 | 3/2009 | Minervini | |
| 7,537,964 | B2 | 5/2009 | Minervini | |
| 7,633,156 | B2 | 12/2009 | Minervini | |
| 8,018,049 | B2 | 9/2011 | Minervini | |
| 8,121,331 | B2 | 2/2012 | Minervini | |
| 8,134,375 | B2 * | 3/2012 | Boom | 324/679 |
| 8,170,244 | B2 | 5/2012 | Ryan | |
| 8,314,458 | B2 * | 11/2012 | Otake | H01L 29/0626 257/324 |
| 8,358,004 | B2 | 1/2013 | Minervini | |
| 8,450,817 | B2 | 5/2013 | Minervini | |
| 8,457,332 | B2 | 6/2013 | Loeppert | |
| 8,526,665 | B2 | 9/2013 | Lutz | |
| 8,594,347 | B2 | 11/2013 | Ryan | |
| 8,617,934 | B1 | 12/2013 | Minervini | |
| 8,623,709 | B1 | 1/2014 | Minervini | |
| 8,623,710 | B1 | 1/2014 | Minervini | |
| 8,624,384 | B1 | 1/2014 | Minervini | |
| 8,624,385 | B1 | 1/2014 | Minervini | |
| 8,624,386 | B1 | 1/2014 | Minervini | |
| 8,624,387 | B1 | 1/2014 | Minervini | |
| 8,629,005 | B1 | 1/2014 | Minervini | |
| 8,629,551 | B1 | 1/2014 | Minervini | |
| 8,629,552 | B1 | 1/2014 | Minervini | |
| 8,633,064 | B1 | 1/2014 | Minervini | |
| 8,652,883 | B1 | 2/2014 | Minervini | |
| 8,687,823 | B2 | 4/2014 | Loeppert | |
| 8,704,360 | B1 | 4/2014 | Minervini | |
| 8,765,530 | B1 | 7/2014 | Minervini | |
| 8,781,140 | B2 | 7/2014 | Lautenschlager | |
| 8,791,531 | B2 | 7/2014 | Loeppert | |
| 8,879,767 | B2 | 11/2014 | Wickstrom | |
| 8,969,980 | B2 | 3/2015 | Lee | |
| 8,987,030 | B2 | 3/2015 | Loeppert | |
| 8,995,694 | B2 | 3/2015 | Vos | |
| 9,006,880 | B1 | 4/2015 | Minervini | |
| 9,023,689 | B1 | 5/2015 | Minervini | |
| 9,024,432 | B1 | 5/2015 | Minervini | |
| 9,040,360 | B1 | 5/2015 | Minervini | |
| 9,051,171 | B1 | 6/2015 | Minervini | |
| 9,059,630 | B2 | 6/2015 | Gueorguiev | |
| 9,061,893 | B1 | 6/2015 | Minervini | |
| 9,067,780 | B1 | 6/2015 | Minervini | |
| 9,078,063 | B2 | 7/2015 | Loeppert | |
| 9,096,423 | B1 | 8/2015 | Minervini | |
| 9,133,020 | B1 | 9/2015 | Minervini | |
| 9,137,595 | B2 | 9/2015 | Lee | |
| 9,139,421 | B1 | 9/2015 | Minervini | |
| 9,139,422 | B1 | 9/2015 | Minervini | |
| 9,148,731 | B1 | 9/2015 | Minervini | |
| 9,150,409 | B1 | 10/2015 | Minervini | |
| 2003/0151877 | A1 | 8/2003 | Young et al. | |
| 2004/0253760 | A1 | 12/2004 | Zhang | |
| 2005/0213781 | A1 | 9/2005 | Suzuki et al. | |
| 2007/0215962 | A1 | 9/2007 | Minervini | |
| 2008/0142475 | A1 | 6/2008 | Loeppert | |
| 2008/0217709 | A1 | 9/2008 | Minervini | |
| 2009/0086992 | A1 | 4/2009 | Hsu et al. | |
| 2010/0166229 | A1 * | 7/2010 | Pennock et al. | 381/122 |
| 2011/0026174 | A1 * | 2/2011 | Klein et al. | 361/56 |
| 2012/0039499 | A1 | 2/2012 | Ryan | |
| 2012/0139066 | A1 | 6/2012 | Je et al. | |
| 2012/0223770 | A1 * | 9/2012 | Muza | 327/581 |
| 2012/0242400 | A1 | 9/2012 | Shaeffer et al. | |
| 2013/0044898 | A1 | 2/2013 | Schultz | |
| 2013/0058506 | A1 | 3/2013 | Boor | |
| 2013/0108074 | A1 | 5/2013 | Reining | |
| 2013/0177192 | A1 | 7/2013 | Abry | |
| 2014/0037115 | A1 | 2/2014 | Vos | |
| 2014/0037120 | A1 | 2/2014 | Lim | |
| 2014/0037124 | A1 | 2/2014 | Lim | |
| 2014/0064546 | A1 | 3/2014 | Szczech | |
| 2014/0133686 | A1 | 5/2014 | Lee | |
| 2014/0197887 | A1 | 7/2014 | Hovesten | |
| 2014/0291783 | A1 | 10/2014 | Talag | |
| 2014/0291784 | A1 | 10/2014 | Conklin | |
| 2014/0294209 | A1 | 10/2014 | Szczech | |
| 2014/0321687 | A1 | 10/2014 | Friel | |
| 2015/0058001 | A1 | 2/2015 | Dai | |
| 2015/0063594 | A1 | 3/2015 | Nielsen | |
| 2015/0117681 | A1 | 4/2015 | Watson | |
| 2015/0139428 | A1 | 5/2015 | Reining | |
| 2015/0166335 | A1 | 6/2015 | Loeppert | |
| 2015/0172825 | A1 | 6/2015 | Lim | |
| 2015/0195659 | A1 | 7/2015 | Szczech | |
| 2015/0208165 | A1 | 7/2015 | Volk | |
| 2015/0251898 | A1 | 9/2015 | Vos | |
| 2015/0256916 | A1 | 9/2015 | Volk | |

* cited by examiner

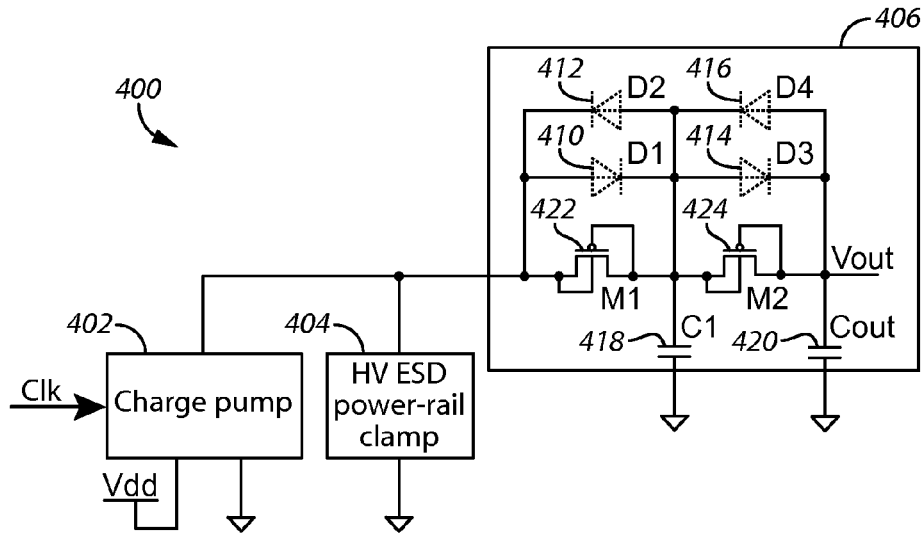
*FIG. 4*
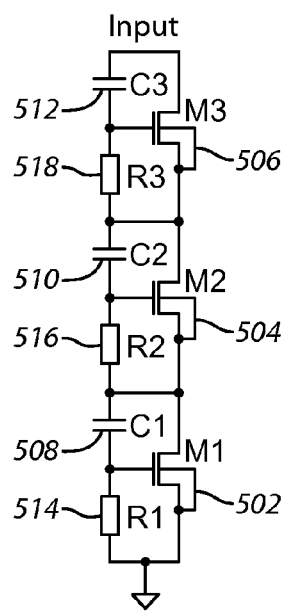 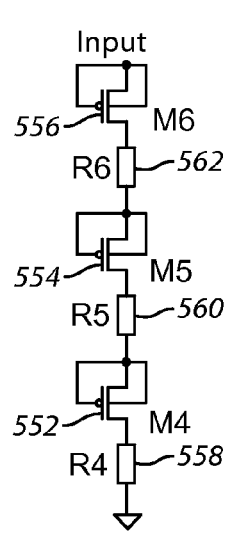 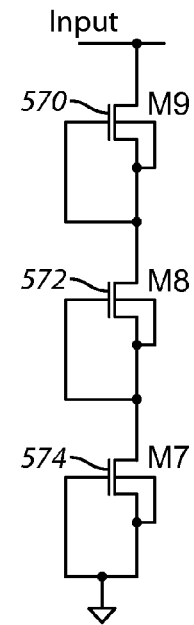
*FIG. 5A*  *FIG. 5B*  *FIG. 5C*

US 9,343,455 B2

APPARATUS AND METHOD FOR HIGH VOLTAGE I/O ELECTRO-STATIC DISCHARGE PROTECTION

CROSS-REFERENCE TO RELATED APPLICATION

This patent claims benefit under 35 U.S.C. §119 (e) to U.S. Provisional application No. 61/739,284, filed Dec. 19, 2012 and entitled "Apparatus and Method for High Voltage I/O Electrostatic Discharge Protection in Standard Low Voltage CMOS Process," the contents of which are incorporated herein by reference in their entirety.

TECHNICAL FIELD

This application relates to electrostatic discharge (ESD) protection of high voltage I/O in microphone circuits.

BACKGROUND OF THE INVENTION

The condenser microphone is a widely used type of microphone. In some respects, this microphone can be considered a variable capacitor whose capacitive value is modulated by the pressure of an incoming sound wave. In this view, one of the capacitor plates is static, while the other one is mobile (i.e., the moving diaphragm component). The sound wave changes the distance between the plates, and this respectively changes the capacitance of the representative capacitor.

The MEMS microphone is in some aspects a variant of a condenser microphone and is produced by using silicon micro-fabrication techniques. Compared to the conventional microphone, the MEMS microphone has several advantages such as a reduced size, lower temperature coefficient and higher immunity to mechanical shocks. In addition, the MEMS microphone takes advantage of lithography processes, which are particularly suitable and advantageous for the mass production of devices.

One approach to obtain a useful electrical signal from such microphone is to maintain a constant charge Q on the capacitor. The voltage across the capacitor will change inversely proportionally to the incoming sound wave pressure according to the equation $V=Q/C$, consequently $dV=-VdC/C$. In practice $dC/C$ is relatively small because of mechanical and linearity considerations. In order to get sufficient sensitivity, a high DC voltage V across the capacitor is needed.

Metal Oxide Semiconductor (MOS) devices are quite sensitive to Electro-Static Discharge (ESD) damage. The problem is especially pronounced in deep submicron Complementary Metal Oxide Semiconductor (CMOS) processes because the gate oxide of the transistors is just few nanometers thick. In order to protect chips, inputs and outputs are often equipped with dedicated ESD protection circuitry. Unfortunately, previous attempts at solving the ESD discharge problem using this circuitry have shortcomings and have failed to adequately address the problem.

BRIEF DESCRIPTION OF THE DRAWINGS

For a more complete understanding of the disclosure, reference should be made to the following detailed description and accompanying drawings wherein:

FIG. 4 comprises a block diagram of a system that uses a high voltage ESD power rail clamp according to various embodiments of the present invention;

FIGS. 5A, 5B, and 5C comprise electrical diagrams of high voltage ESD power rail clamps according to various embodiments of the present invention;

Figure 1:
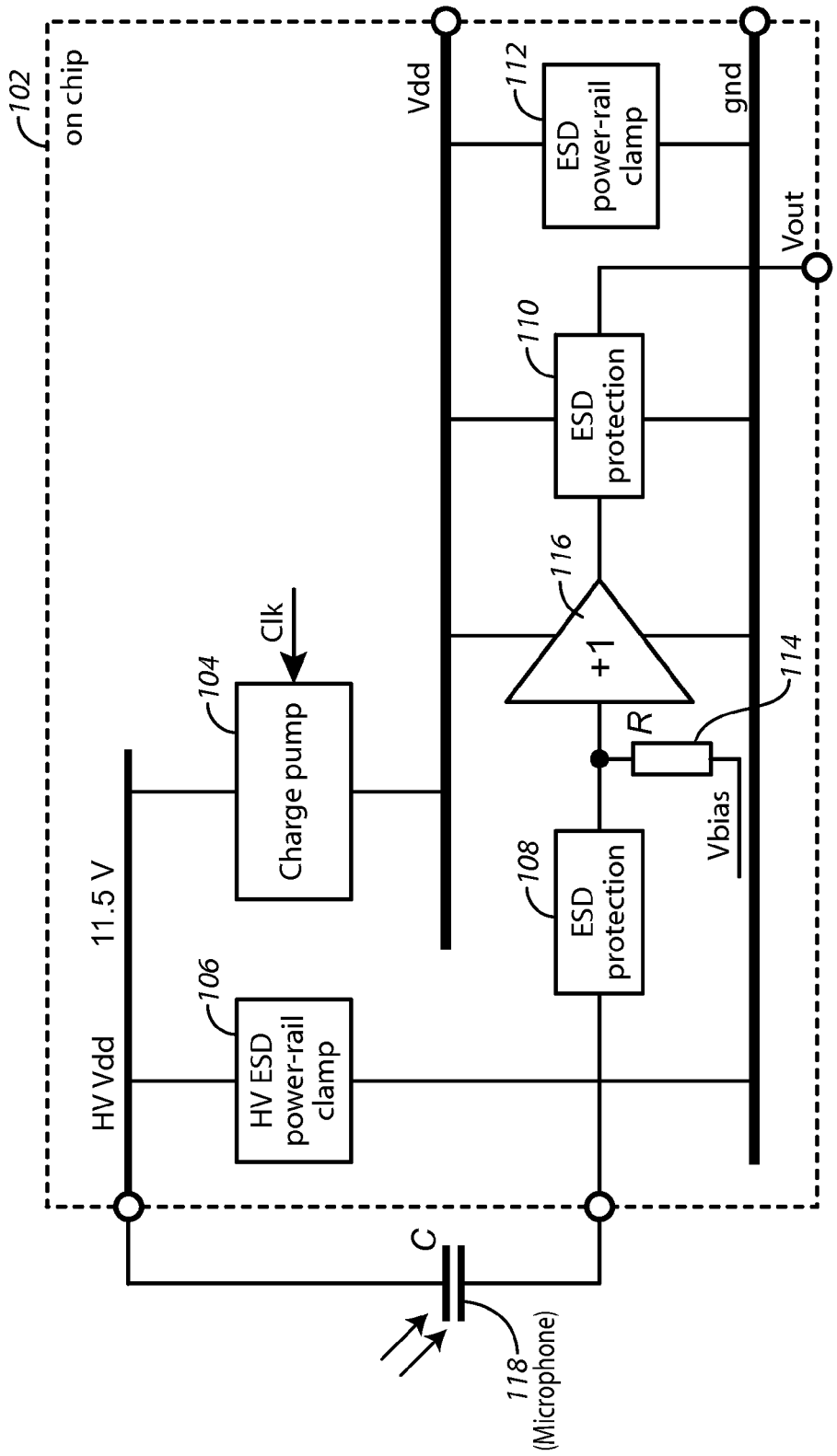
FIG. 1 is a schematic diagram of a MEMS microphone interface electronics with ESD protection according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

Approaches are provided herein for a high voltage ESD power-rail clamp to be used with or at a charge pump output. ESD protection approaches for the high voltage terminal of a MEMS microphone can be implemented in a standard low voltage CMOS process. By "process" and as used herein, it is meant the construction process.

In some aspects of the present approaches, the output of a charge pump can withstand high ESD voltages. Consequently, high voltage ESD power rail clamps can be implemented with stacked standard low voltage transistors. In one example, the high voltage operation of the high voltage ESD power rail clamps is achieved by forming high voltage NWELL/DNWELL regions of the PMOS and NMOS transistors used to construct the high voltage ESD power rail clamps. In this way, the NWELL/DNWELL to substrate breakdown voltage is increased from about 10 V to 45 V in a standard 0.18 CMOS process. As a result, the need for an expensive high voltage process to construct these devices is eliminated. The high voltage ESD power rail clamp can also be moved from the output of the charge pump filter to the output of the charge pump in order to cope with the leakage current requirement.

In other aspects, the ESD protection approaches described herein utilize a high voltage Laterally Diffused MOS (LD-MOS) transistor. In such devices, the high voltage operation is achieved by forming a high voltage NWELL at the drain terminal of the transistor. In this way, the drain to source (substrate) breakdown voltage is increased from approximately 10 V to 45 V in a standard 0.18 CMOS process. Thus, the need for an expensive high voltage process is eliminated in this approach as well.

In order to reduce the size, the price, and the power consumption of the microphone interface electronics, it is advantageous to integrate or dispose the device on a single chip. A CMOS process is typically chosen for the purpose because of its low cost and the availability of transistors with very high input impedance. Furthermore, this is the process that is also typically selected for a system on chip with a relatively large digital core.

In many of these embodiments, an electronics chip includes a charge pump and at least one high voltage (HV) electro-static discharge (ESD) module. The charge pump is configured to provide a predetermined voltage across a microphone. The devices described herein are implemented in a standard low voltage CMOS process and has a circuit topology that provides an inherent ESD protection level (when it is powered down), which is higher than the operational (predetermined) DC level. At least one high voltage (HV) electro-static discharge (ESD) module is coupled to the output of the charge pump. The HV ESD module is configured to provide ESD protection for the charge pump and a microelectromechanical system (MEMS) microphone that is coupled to the chip. The at least one HV ESD module includes a plurality of PMOS or NMOS transistors having at least one high voltage NWELL/DNWELL region formed within selected ones of the PMOS or NMOS transistors. The at least one high voltage NWELL/DNWELL region has a breakdown voltage sufficient to allow a low voltage process to be used to construct the chip and still allow the HV ESD module to provide ESD protection for the chip.

Referring now to FIG. 1, one example of a system for preventing electro-static discharge (ESD) is shown. A chip 102 includes a charge pump 104, a high voltage (HV) ESD power rail clamp module 106, an ESD power rail clamp module 112, a first ESD protection module 108, a second ESD protection module 110, a bias resistor 114, and an amplifier 116. A microphone 118 is coupled to the chip 102. The ESD power rail clamp module 112 is a conventional low voltage (e.g., 3 volts) module.

The microphone 118 produces a change in voltage $dV=-VdC/C$ where V is the voltage at the output of the pump 104, and C is the capacitance of the microphone 108. The charge pump 104 provides a sufficiently high voltage V across the microphone. In one aspect, the charge pump is the same and constructed according to the same principles as described in U.S. patent application Ser. No. 13/596,229, filed Aug. 28, 2012, entitled "High Voltage Multiplier for a Microphone and Method of manufacture," naming Svetoslav Gueorguiev as inventor, the content of which is incorporated herein by reference in its entirety. For example, the device described with respect to FIG. 4 in application Ser. No. 13/596,229 may be used. Other examples are possible. The microphone 118 may be any MEMS microphone that includes a diaphragm, back plate, and all other elements typically associated with MEMS microphones.

The HV ESD power rail clamp module 106 and the ESD power rail clamp module 112 provide ESD protection for the other elements on the chip and the microphone 118. More specifically, the use of a Laterally Diffused MOS (LDMOS) transistor topology (described elsewhere herein) with a high voltage NWELL region provides a high voltage transistor in a standard low voltage CMOS process for high voltage ESD power rail clamp module 106. Advantageously, the approaches described herein provide the high voltage ESD power rail clamps required to control ESD on the chips described herein.

The first ESD protection module 108 and the second ESD protection module 110 provide ESD protection for the system. The bias resistor 114 has a high value so that it forms a low pass RC filter for the bias voltage, while it has a high pass characteristic for the variable voltage across the microphone 118. The high DC voltage (e.g., 11.5 V) needed across the microphone 118 is provided by the charge pump 104. The amplifier 116 provides a buffer for the circuit.

In this example, a useful electrical signal is obtained from the microphone 118 by maintaining a constant charge Q on the equivalent capacitor C (representing the microphone 118). The voltage across the capacitor will change inversely proportionally to the incoming sound wave pressure according to the equation $V=Q/C$, consequently $dV=-VdC/C$. In practice $dC/C$ is relatively small because of mechanical and linearity considerations. In order to get sufficient sensitivity a high DC voltage V across the capacitor (microphone 118) is needed.

A possible biasing scheme that provides a (nearly) constant charge on the microphone is shown in FIG. 1. The resistor 114 preferably has a very high value (e.g., 1 tera ohms) so that it forms a low pass RC filter for the bias voltage, while it has a high pass characteristic for the variable voltage across the microphone 118. The high DC voltage that is needed across the capacitor is typically provided by the charge pump 104 that acts as a capacitive voltage multiplier. For the particular MEMS element shown in FIG. 1, the charge pump 104 provides an output voltage of approximately 11.5 V. The voltage Vbias is set to ground in order to have maximum DC voltage across the capacitor (microphone 118). For proper operation the unity gain buffer 116 preferably has a very high input resistance and a very low input capacitance.

As will be understood, MOS devices are typically quite sensitive to Electro-Static Discharge (ESD) damage. The problem is often especially pronounced in deep sub-micron CMOS process because the gate oxide of the transistors is just few nm thick. In order to protect the chip, the input/outputs of the chip are advantageously equipped with a dedicated ESD protection circuitry.

The High Voltage (HV) ESD power-rail clamp 106 and the charge pump 104 are the only high voltage elements on the chip. In order to lower the cost even further, it is advantageous to implement these components in a standard low voltage CMOS process.

Figure 2:
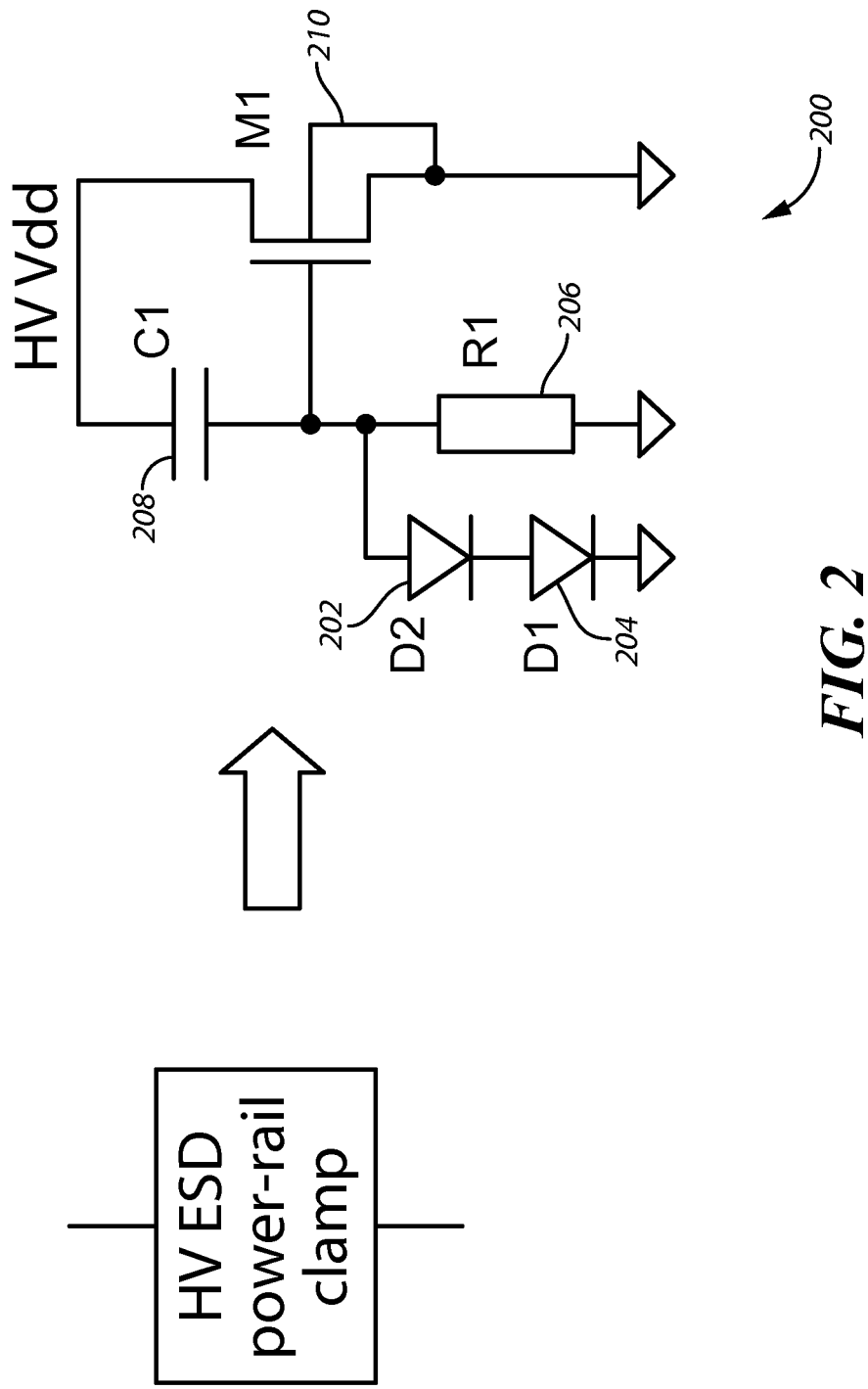
FIG. 2 is a schematic diagram of a high voltage (HV) ESD power rail clamp apparatus according to various embodiments of the present invention.

Referring now to FIG. 2, one example of the high voltage power-rail clamp circuit (e.g., the circuit 106 of FIG. 1) is described. The circuit 200 includes a first diode (D1) 204, a second diode (D2) 202, a resistor (R1) 206, a capacitor (C1) 208, and a transistor (M1) 210.

The first diode (D1) 204 and the second diode (D2) 202 act as voltage limiting diodes. The resistor (R1) 206 and the capacitor (C1) 208 act to form an RC network. The transistor (M1) 210 in one aspect is a Laterally Diffused MOS transistor (LDMOS) as described elsewhere herein. More specifically, it will be appreciated that the LDMOS transistor topology including a high voltage NWELL region provides a high voltage transistor in a low voltage CMOS process. The clamps thereby provided are the high voltage ESD power rail clamps required on the chip to effectively control ESD on the chip.

In one example of the operation of the circuit shown in FIG. 2, an electrostatic discharge is detected by the R1-C1 network, which drives the shunting transistor (M1) 210. The diodes 204 and 202 (D1 and D2) limit the maximum voltage between the gate and source terminals of the transistor (M1) 210. An additional current limiting resistor, which is not shown in FIG. 2 may be connected in series with the diodes (D1 and D2). During normal operation (i.e., no electrostatic discharge), the transistor (M1) 210 is off and the circuit (including M1) does not draw current from Vdd. The breakdown voltages between the drain and source and between the drain and gate have to be higher than HV Vdd (e.g., 11.5 V). When these voltages are higher than the nominal one for a given process (e.g., 1.8 V for 0.18 um CMOS) a real high voltage transistor is needed which is not available in previous CMOS design kits. Consequently, a Laterally Diffused MOS transistor (LDMOS) in a standard low voltage CMOS process having a high voltage NWELL (NW) is provided.

Figure 3:
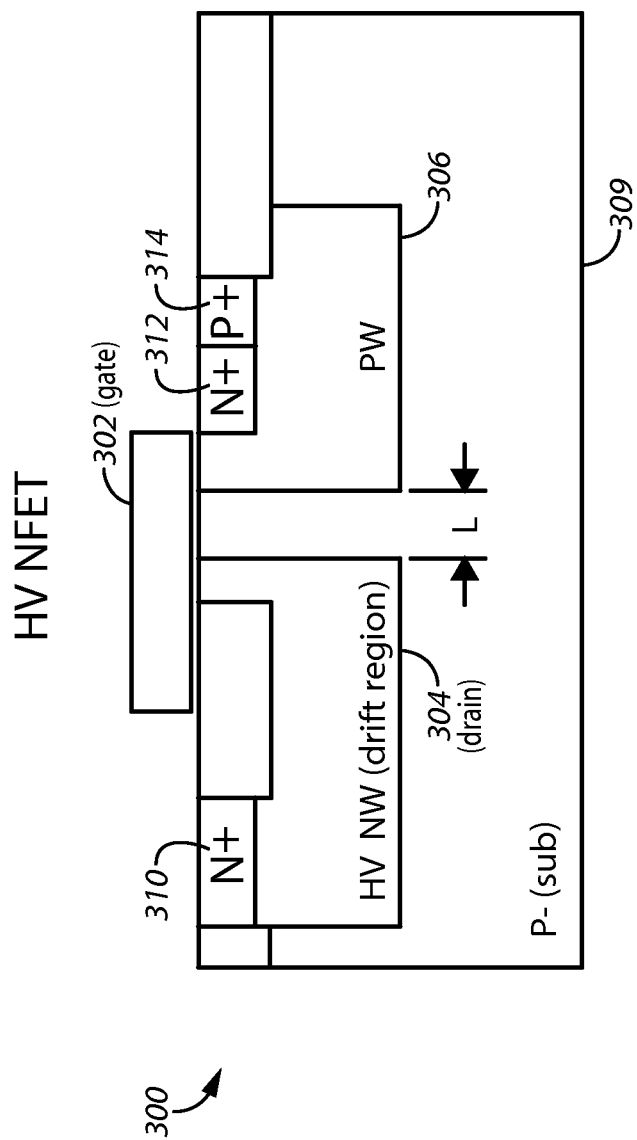
FIG. 3 is a diagram of a transistor in a CMOS process that is used in the high voltage ESD power rail clamp apparatus according to various embodiments of the present invention.

Referring now to FIG. 3, a Laterally Diffused MOS transistor (LDMOS) in a standard low voltage CMOS process having a high voltage NWELL (NW) region (serving as a drain) is described. The transistor, for example, is the transistor 210 (M1) in FIG. 2. The transistor 300 includes a gate 302, an NWELL region 304, a PWELL region 306, and a P− region 308. The NWELL region 304 includes an N+ region 310. The PWELL region 306 includes an N+ region 312 (serving as a source) and a P+ region 314. A separation distance L separates the NWELL region 304 from all neighboring PWELL regions (like 306).

The gate 302 is usually constructed of silicon dioxide plus a conductive layer on top of it and acts as one electrical terminal for the transistor. The N+ region 312 and the NWELL region 304 form the source and the drain of the NMOS transistor.

The HV NWELL region 304 is lightly doped with donor atoms. The PWELL region 306 is lightly doped with acceptor atoms. The P− region 308 is very lightly doped with acceptor atoms. The HV NWELL region 304 increases the breakdown voltage between the drain and the substrate and allows the system to handle high voltages.

The N+ region 310 and N+ region 312 are heavily doped with donor atoms and act as electrical contacts. The P+ region 314 is heavily doped with acceptor atoms and acts as a connection with the substrate 308.

Referring now to FIG. 4, an example of a system 400 with a charge pump filter with a high voltage ESD power rail clamp is described. The system 400 includes a charge pump 402, a high voltage ESD power rail clamp 404, and a filter 406. The filter 406 includes a first diode (D1) 410, a second diode (D2) 412, a third diode (D3) 414, a fourth diode (D4) 416, a first capacitor (C1) 418, a second capacitor (Cout) 420, a first transistor (M1) 422, and a second transistor (M2) 424. The purpose of the filter 406 is to provide noise filtering of the charge pump noise. It will be appreciated that the MEMS elements of the microphone (e.g., a structure including the diaphragm and back plate) is also attached to the output of the filter 406 but is not shown in FIG. 4 for simplicity.

In one aspect, the charge pump 402 is the same and constructed according to the same principles as described in U.S. patent application Ser. No. 13/596,229, filed Aug. 28, 2012, entitled "High Voltage Multiplier for a Microphone and Method of manufacture," naming Svetoslav Gueorguiev as inventor, the content of which is incorporated herein by reference in its entirety. For example, the device of FIG. 4 in that document may be used. Other examples are possible.

The high voltage ESD power rail clamp 404 performs electro static discharge functions. The high voltage ESD power rail clamp 404 may be designed according to the designs shown in FIG. 2 or FIG. 5A or FIG. 5B. Furthermore, it will be appreciated that the transistors of FIG. 5A or FIG. 5B may be constructed according to the approaches shown in either FIG. 6 or FIG. 7.

In one example of the operation of FIG. 4, the output of the charge pump 402 can handle an electrostatic discharge of about 40 volts using the Human body model (HBM) when the pump is not powered up. Hence, the output of the filter can handle approximately 40 V+ two diode voltage drops, which is approximately 41 volts. In one aspect, the ESD (transient) activation level of the desired high voltage ESD power rail clamp can be up to approximately 40 V (with a proper margin included). However, with respect to the DC voltage across the high voltage ESD power rail clamp 404 it must withstand approximately 13 volts (in one example) without being activated because this level is the normal operating level.

On the other hand, in order to have sufficient noise filtering the output filter must not be loaded with more than 1 pA across the full temperature range. In practice, this is a very high requirement for the known HV ESD topologies. In order to alleviate it, the high voltage ESD power rail clamp 404 is positioned at the output of the charge pump 402.

The charge pump 402 has relatively low output impedance and can supply the high voltage ESD power rail clamp 404. However, in this case the large ESD current from the output of the filter to the high voltage ESD power rail clamp 404 has to pass through the transistors 422 (M1) and 424 (M2). These are minimum size devices for good noise filtering and they typically cannot handle large currents. In order to provide a high current path, the transistors 422 (M1) and 424 (M2) are shunted with the diodes 410 (D1), 412 (D2), and 414 (D3), 416 (D4) correspondingly. These diodes must be sufficiently large such as having a perimeter of 30 um. In other words, the diodes 410 (D1), 412 (D2), and 414 (D3), 416 (D4) provide protection for the transistors 422 (M1) and 424 (M2). The function of the capacitors 418 (C1) and 420 (Cout) is to form a second order RC filter with the off devices M1, M2, D1, D2, D3 and D4.

Consequently, the high voltage ESD power rail clamp 404 can be implemented with stacked standard low voltage transistors. In this respect, the high voltage operation of the high voltage ESD power rail clamp 404 is achieved by forming high voltage NWELL/DNWELL regions for the PMOS and NMOS transistors used to construct the high voltage ESD power rail clamps. In this way the NWELL/DNWELL to substrate breakdown voltage is increased from approximately 10 V to 45 V in a standard 0.18 CMOS process. As a result, the need for an expensive high voltage process is eliminated. Sufficient ESD protection is also provided.

It will be understood that different charge pumps can withstand different voltage levels. Some, for example, may withstand only approximately 3 volts (when they are not powered) while others may with stand approximately 40 volts. For example, charge pump 104 in FIG. 1 may withstand approximately 3 volts (when it is not powered) while charge pump 402 in FIG. 4 may withstand approximately 40 volts. The high voltage ESD power rail clamps described herein can also vary as to their triggering approach. For instance, the high voltage ESD power rail clamp 106 shown in FIG. 1 may react to voltage jumps of approximately 3 volts. The high voltage ESD power rail clamp shown in FIG. 5A may also react to voltage jumps of approximately 6 volts. The high voltage ESD power rail clamp of FIG. 5B may react to absolute static voltage levels of approximately 16 volts. Because the charge pump in FIG. 4 can withstand approximately 40 volts, the approaches of FIGS. 5A and 5B can be used for the high voltage ESD power rail clamp and advantageously and at the same time, the pump is not damaged by ESD events.

Referring now to FIG. 5A, a high voltage ESD power rail clamp includes a first transistor (M1) 502, a second transistor (M2) 504, a third transistor (M3) 506, a first capacitor (C1) 508, a second capacitor (C2) 510, a third capacitor (C3) 512, a first resistor (R1) 514, a second resistor (R2) 516, and a third resistor (R3) 518. In one aspect and in the circuit of FIG. 5A, to ensure high voltage operation of the high voltage ESD power rail clamp the PMOS and the NMOS transistors are placed in HV NWELL/DNWELL correspondingly shown in FIG. 6 or FIG. 7

In one aspect, the maximum DC voltage that the structure can handle is the maximum voltage of a single transistor multiplied by the number of stacked transistors. In the present case and to take one example, this is approximately 4.3 V multiplied by 3, which equals approximately 12.9 V. Thick gate oxide transistors were used to construct the transistors. However, thin gate oxide transistors may also be used. In this later case, the number of stacked stages has to be increased.

The high voltage ESD power rail clamp must not affect the normal operation of the protected circuit. The high voltage ESD power rail clamp must be activated only during an ESD event providing a low ohmic path to ground for the large ESD current. The high voltage ESD power rail clamp must also function when the protected circuit is not powered up.

As shown, the high voltage ESD power rail clamp of FIG. 5A consists of three stacked identical stages—a first stage (the first resistor 514 (R1), the first capacitor (C1) 508, the first transistor (M1) 502); a second stage (the second resistor (R2) 516, second capacitor (C2) 510, the second transistor (M2) 504 and a third stage (the third resistor (R3) 518, third capacitor (C3) 512, the third transistor (M3) 506). Each of these stages is a "Gate-Coupled NMOS" protection stage. During a normal operation a DC voltage of 12 V is applied at the input of the stack. This voltage is equally divided between the three stages so that at the drain of the first transistor (M1) 502 there is 4 V and at the drain of the second transistor (M2) 504 8 V. The capacitors 508 (C1), 510 (C2), and 512 (C3) are charged to 12/3=4 V. The Vgs of all transistors is zero and they are off.

During a positive electrostatic discharge, the voltage rises sharply at the input node. The voltages across the capacitors 508 (C1), 510 (C2) and 512 (C3) cannot change instantly due to the first resistor 514 (R1), the second resistor (R2) 516, and the third resistor (R3) 518. The result is that the voltage change at the input node is equally distributed between the gate source terminals of the first transistor (M1) 502, the second transistor (M2) 504, and third transistor (M3) 506. If this voltage change is 3 times higher than the threshold voltage of the first transistor (M1) 502, the second transistor (M2) 504 and the third transistor (M3) 506, the transistors turn on and provide a low ohmic current path from the input to ground. At a later point in time the first transistor (M1) 502, the second transistor (M2) 504 and the third transistor (M3) 506 may also start operating in avalanche snap back mode (See FIG. 8). When the protected circuit is not powered up the voltages across the capacitors 508 (C1), 510 (C2) and 512 (C3) are equal to zero and the input node voltage change is again equally distributed between the gate source terminals of the first transistor (M1) 502, the second transistor (M2) 504 and the third transistor (M3) 506 turning them on analogously.

During a negative electrostatic discharge (the input gets a negative voltage with respect to ground) there is a low ohmic current path formed by the DNWELL diode of the third transistor (M3) 506 to ground.

Referring now to FIG. 5B, another example of a high voltage ESD power rail clamp is shown. The high voltage ESD power rail clamp includes a first transistor (M4) 552, a second transistor (M5) 554, a third transistor (M6) 556, a first resistor 558, a second resistor 560, and a third resistor 562.

Figure 6:
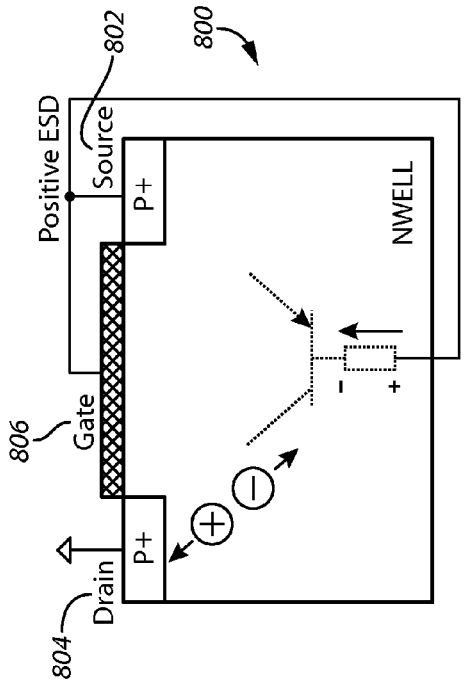
FIG. 6 is a cross section of a CMOS wafer with substrate blocking doping around the NWELL of a transistor that is used in a high voltage ESD power rail clamp device according to various embodiments of the present invention.
Figure 7:
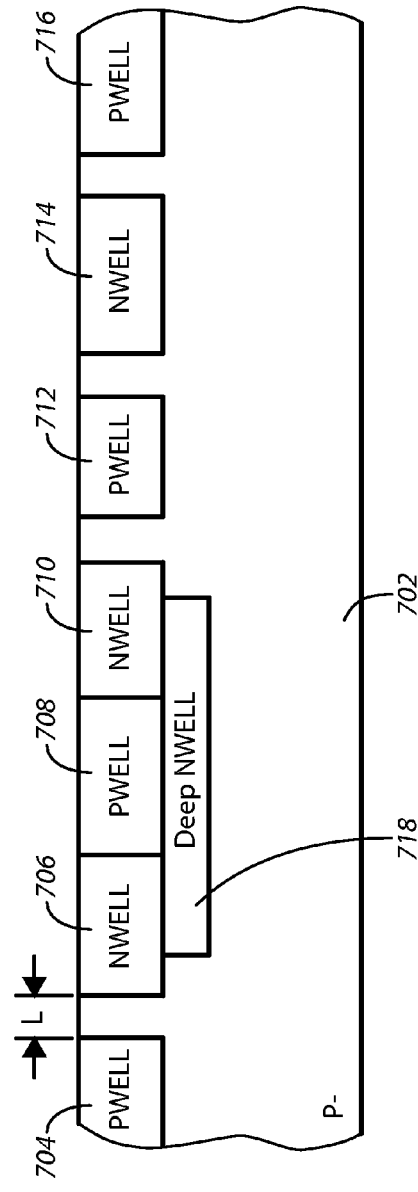
FIG. 7 is a cross section of a CMOS wafer, this structure being used in a high voltage ESD power rail clamp device according to various embodiments of the present invention.

In the circuit of FIG. 5 and in order to ensure high voltage operation of the high voltage ESD power rail clamp, the PMOS and the NMOS transistors have to be placed in HV NWELL/DNWELL correspondingly shown in FIG. 6 or FIG. 7.

In one aspect, the maximum DC voltage that the structure can handle is the maximum voltage of a single transistor multiplied by the number of stacked transistors. In the present case, this is 4.3 V multiplied by 3 equals 12.9 V. Thick gate oxide transistors can be used to construct the transistors. Alternatively, thin gate oxide transistors may also be used. In this later case, the number of stacked stages has to be increased.

The high voltage ESD power rail clamp of FIG. 5B consists of three stacked identical stages—a first stage (R4, the first transistor (M4) 552), a second stage (R5, the second transistor (M5) 554) and a third stage (R6, the third transistor (M6) 556). Each of these is referred to as a "Grounded-Gate PMOS" protection stage. During a normal operation a DC voltage of 12 V is applied at the input of the stack. This voltage is equally divided between the three stages so that at the drain of the first transistor (M4) 552 there is approximately 4 V and at the drain of the second transistor (M5) 554 that is approximately 8 V. The Vgs (gate to source) of all transistors is zero and they are off.

During a positive electrostatic discharge the voltage rises sharply at the input node. The voltage change is equally distributed between the three stages. Above an input voltage of approximately 17 V the transistors 552 (M4), 554 (M5), and 556 (M6) start operating in avalanche breakdown snapback. The parasitic PNP transistors are turned on and a low ohmic path to ground is provided.

Figure 8:
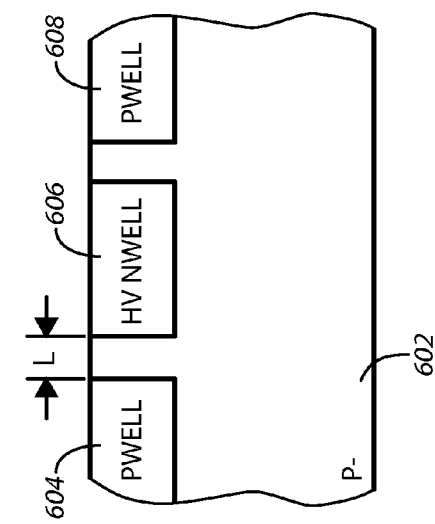
FIG. 8 shows a transistor as used in avalanche breakdown snapback operation according to various embodiments of the present invention.

Referring now to FIG. 8, the avalanche breakdown snapback operation for a single transistor 800 is shown and described. The transistor 800 includes a source, 802, a drain 804, and a gate 806. The circuit operates as follows. First, the avalanche breakdown by reverse bias at the drain junction occurs. Second, a voltage drop by the bulk current occurs. Third, the substrate (Base) to source (Emitter) junction becomes forward biased. Fourth, the parasitic PNP transistor turns on.

Returning now to FIG. 5B, during a negative ESD event there is a low ohmic current path formed by the NWELL diode of the third transistor (M6) 556 to ground.

Referring now to FIG. 5C, another example of HV ESD clamp is described. This example operates in the same way as the example of FIG. 5B. The example of FIG. 5C is implemented with NMOS transistors 570, 572, and 574 instead of PMOS ones. Resistors are omitted. Instead, the NMOS transistors 570, 572, and 574 are made large.

Referring now to FIG. 6, one example of the separation of NWELL and PWELL regions on a substrate is described. This structure can be used in the transistors of FIG. 1, FIG. 2, FIG. 3, FIG. 4, FIG. 5A and FIG. 5B. The substrate 602 includes a first P well region 604, an NWELL region 606, and a second PWELL region 608. The region 606 is separated by the PWELL by a distance L.

The HV NWELL region 606 has a high breakdown voltage between the NWELL and the substrate and its formation is shown in FIG. 6. This contrasts with previous CMOS processes, where the area that is not an NWELL is automatically formed (doped) as PWELL. In these previous approaches, the breakdown voltage between the NWELL region and the substrate is limited by the breakdown voltage of the sidewall component of the NWELL to PWELL/substrate junction. In a typical 0.18 um CMOS process, this voltage for previous approaches is about 10 volts.

It will be appreciated that the bottom component of the NWELL to PWELL/substrate junction has a higher breakdown voltage because the substrate has a lower doping level than the PWELL regions. As shown in the present approaches and in particular in FIG. 6, by blocking the formation of the PWELL regions 604 and 608 around the NWELL region 606, it is ensured that the NWELL region 606 is entirely surrounded by a low doped substrate, thereby increasing the breakdown voltage of the NWELL to substrate junction in FIG. 6. In other words, this blocking is accomplished using a blocked area that has a length L.

Depending on the length L of the blocked area, the breakdown voltage under question can be increased from 10 to about 45 volts in a standard 0.18 um CMOS process. The combination of appropriate circuit topology (limited by the maximum voltage between the NWELL and the substrate (Vnwell–sub)) and the described substrate doping blocking around the critical NWELL region(s) 606 allows the implementation of a high output voltage charge pump in a standard low voltage CMOS process. In one example, L is approximately 1.8 microns and ranges between approximately 0.7 microns and 2 microns. Other examples of values for L are possible.

It will be understood that the bottom component of the same junction has a higher breakdown voltage because the substrate has a lower doping level than the PWELL. By blocking the formation of the PWELL around the NWELL, it is ensured that the NWELL is entirely surrounded by a low doped substrate, increasing the breakdown voltage of the NWELL to substrate junction. Depending on the length L of the 'blocked area' the breakdown voltage under question can be increased from approximately 10 to about 45 volts in a standard 0.18 um CMOS process to take one example.

It will also be appreciated that the combination of an LDMOS transistor topology and the described high voltage NWELL region provide a high voltage transistor in a standard low voltage CMOS process. The approaches described herein provide the high voltage ESD power clamps required to control ESD. In one aspect, the bottom component of the NWELL to substrate junction has a higher breakdown voltage than the lateral one, because the substrate has a lower doping level than the PWELL.

Referring now to FIG. 7, one example of the CMOS structure for the transistors of the circuits of FIGS. 1, 2, 4, 5A, and 5B is described. A substrate 702 includes PWELL regions 704, 708, 712, and 716 and NWELL regions 706, 710, and 714 and a deep NWELL region 718. The transistors are constructed using a triple-well process with substrate doping blocking around the NWELL regions and around the Deep NWELL region 718. The doping blocking works in the same way as has been described elsewhere herein.

The substrate 702 is very lightly doped with acceptor atoms (P−). The PWELL regions 704, 708, 712, and 716 are lightly doped with acceptor atoms and the NWELL regions 706, 710, 714 are lightly doped with donor atoms, and the Deep NWELL region is lightly doped with donor atoms. These regions form the bulks of the transistors. The PWELL regions (704, 712 and 716) form the bulk of the NMOS transistors. The PWELL region (708) above the Deep NWELL region (718) forms the bulk of the isolated NMOS transistor(s). The NWELL regions form the bulks of the PMOS transistors. Again, there is no full MOS transistor shown in FIG. 7.

In the triple well process of FIG. 7 used to construct the MOS transistors, the breakdown voltage between the NWELL and the substrate and also between the substrate and the Deep NWELL region is limited by the breakdown voltage of the sidewall component of the NWELL to PWELL/substrate junction (without a separation distance L). By adding the separation distance L, the breakdown voltage is increased thereby increasing the maximum output voltage. In one example, L is approximately 1.8 microns and can range between 0.7 microns and 5 microns. Other examples of dimensions are possible.

In one aspect, the bottom component of the NWELL to substrate junction has a higher breakdown voltage than the lateral one, because the substrate has a lower doping level than the PWELL. By blocking the formation of the PWELL around the NWELL as shown in FIG. 7, it is possible to ensure that the NWELL is entirely surrounded by a low doped substrate, increasing the breakdown voltage of the NWELL to substrate junction. Depending on the length L of the "blocked area" the breakdown voltage under question can be increased from 10 to about 45 volts in a standard 0.18 um CMOS process. The formation of the HV DNWELL is similar to that as has already been described.

Preferred embodiments of this invention are described herein, including the best mode known to the inventors for carrying out the invention. It should be understood that the illustrated embodiments are exemplary only, and should not be taken as limiting the scope of the invention.

What is claimed is:

1. An electronics chip, the chip comprising:
   a charge pump, the charge pump configured to provide a predetermined voltage across a microphone, the charge pump being implemented in a low voltage CMOS process;
   at least one high voltage (HV) electro-static discharge (ESD) module coupled to the output of the charge pump, the HV ESD module configured to provide ESD protection for the charge pump and a microelectromechanical system (MEMS) microphone that is coupled to the chip;
   wherein the at least one HV ESD module includes a plurality of PMOS or NMOS transistors wherein selected ones of the PMOS or NMOS transistors include a first PWELL region, a high voltage NWELL region, and a second PWELL region, and the first PWELL region is separated from the high voltage NWELL region by a distance L that completely separates the first PWELL region from the high voltage NWELL region, the distance L being effective increase the breakdown voltage of a NWELL to substrate junction and to allow a low voltage process to be used to construct the chip and still allow the HV ESD module to provide ESD protection for the chip;
   a filter;
   wherein the at least one high voltage (HV) electro-static discharge (ESD) module is coupled between the charge pump and the filter, and wherein the output of the filter is coupled to a microphone transducer.

2. The chip of claim 1 wherein a high voltage terminal is formed at a drain terminal of a selected one of the plurality of NMOS transistors to form an LDMOS transistor, the high voltage terminal is effective to increase a drain to source breakdown voltage of the selected transistor.

3. The chip of claim 1 wherein the microphone comprises a diaphragm and a back plate.

4. The chip of claim 1, wherein the filter comprises at least one diode to provided discharge protection for the filter.

5. The chip of claim 1, wherein the filter comprises at least one diode and at least one active device.

6. An electronics chip, the chip comprising:
   a charge pump, the charge pump configured to provide a predetermined voltage across a microphone, the charge pump being implemented in a low voltage CMOS process;

at least one high voltage (HV) electro-static discharge (ESD) module coupled to the output of the charge pump, the HV ESD module configured to provide ESD protection for the charge pump and a microelectromechanical system (MEMS) microphone that is coupled to the chip;
wherein the at least one HV ESD module includes a plurality of PMOS or NMOS transistors having at least one high voltage NWELL/DNWELL region formed within selected ones of the PMOS or NMOS transistors, the at least one high voltage NWELL/DNWELL region having a breakdown voltage sufficient to allow a low voltage process to be used to construct the chip and still allow the HV ESD module to provide ESD protection for the chip;
a filter;
wherein the at least one high voltage (HV) electro-static discharge (ESD) module is coupled between the charge pump and the filter, and wherein the output of the filter is coupled to a microphone transducer.

7. The chip of claim 6 wherein a high voltage terminal is formed at a drain terminal of a selected one of the plurality of NMOS transistors to form an LDMOS transistor, the high voltage terminal is effective to increase a drain to source breakdown voltage of the selected transistor.

8. The chip of claim 6 wherein the microphone comprises a diaphragm and a back plate.

9. The chip of claim 6, wherein the filter comprises at least one diode to provided discharge protection for the filter.

10. The chip of claim 6, wherein the filter comprises at least one diode and at least one active device.

* * * * *